(12) United States Patent (10) Patent No.: US 11,996,831 B2
Culpin et al. (45) Date of Patent: May 28, 2024

(54) SOLID STATE POWER CONTROLLER

(71) Applicant: Lilium eAircraft GmbH, Wessling (DE)

(72) Inventors: Ed Culpin, Wessling (DE); Thalles Gomes, Wessling (DE); Martin Angerer, Wessling (DE)

(73) Assignee: Lilium eAircraft GmbH, Wessling (DE)

( * ) Notice: Subject to any disclaimer, the term of this patent is extended or adjusted under 35 U.S.C. 154(b) by 0 days.

(21) Appl. No.: 17/651,744

(22) Filed: Feb. 18, 2022

(65) Prior Publication Data

US 2022/0271745 A1 Aug. 25, 2022

(30) Foreign Application Priority Data

Feb. 19, 2021 (EP) ...................................... 21158135

(51) Int. Cl.
*H03K 17/082* (2006.01)
*B64C 29/00* (2006.01)

(52) U.S. Cl.
CPC .......... *H03K 17/0822* (2013.01); *B64C 29/00* (2013.01); *B64D 2221/00* (2013.01)

(58) Field of Classification Search
CPC ................................................ H03K 17/0822
USPC ........................................................ 307/9.1
See application file for complete search history.

(56) References Cited

U.S. PATENT DOCUMENTS

| 5,723,915 | A | 3/1998 | Maher et al. |
| 2016/0023754 | A1 | 1/2016 | Wiegand |
| 2016/0041222 | A1* | 2/2016 | Handy ................... G01R 35/00 324/750.3 |
| 2018/0097515 | A1 | 4/2018 | Norling et al. |
| 2018/0323608 | A1 | 11/2018 | Valdivia Guerrero et al. |
| 2019/0178938 | A1* | 6/2019 | Jin ...................... G01R 31/3167 |
| 2020/0203943 | A1 | 6/2020 | Shen et al. |

FOREIGN PATENT DOCUMENTS

| EP | 0600751 A2 | 6/1994 |
| EP | 3624339 A1 | 3/2020 |
| JP | 2019-110521 A | 7/2019 |

OTHER PUBLICATIONS

"Guidelines for Development of Civil Aircraft and Systems", https://www.sae.org/standards/content/arp4754a/ (Dec. 2010) 3 pages.

(Continued)

*Primary Examiner* — Joseph Chang
(74) *Attorney, Agent, or Firm* — TraskBritt

(57) ABSTRACT

Provided is a solid state power controller (SSPC). The SSPC comprises a power supply line configured to be connected between a power source and a load. Further, the solid state power controller comprises a semiconductor switching unit provided on the power supply line and configured to switch between at least two states according to a command signal. The at least two states include a conducting state and a non-conducting state. Further the solid state power controller comprises a state machine, which is configured to exhibit at least two states, including an ON state and an OFF state. The state machine is further configured to output the command signal according to a current state of the state machine.

19 Claims, 7 Drawing Sheets

(56) References Cited

OTHER PUBLICATIONS

"RTCA DO-254 / EUROCAE ED-80, Design Assurance Guidance for Airborne Electronic Hardware" from RTCA, Inc., http://www.rtca.org/ (Apr. 19, 2000).
European Extended Search Report from European Application No. 21158135.0, dated Aug. 11, 2921, 8 pages.
Mancini, "Op Amps for Everyone: Design Reference", Texas Instruments, Newnes, 2nd edition, Section A 4.9, Apr. 2003, 1 page.
European Communication pursuant to Article 94(3) EPC for European Application No. 21158135.0, dated Dec. 9, 2022, 5 pages.
International Search Report for International Application No. PCT/EP2022/052655, dated Jun. 8, 2022, 4 pages.
International Written Opinion for International Application No. PCT/EP2022/052655, dated Jun. 8, 2022, 6 pages.

\* cited by examiner

SOLID STATE POWER CONTROLLER

CROSS-REFERENCE TO RELATED APPLICATION

Pursuant to 35 U.S.C. § 119(a), this application claims the benefit of the filing date of European Patent Application Serial No. EP21158135.0, filed Feb. 19, 2021, for "Solid State Power Controller," the disclosure of which is hereby incorporated herein in its entirety by this reference.

TECHNICAL FIELD

The present disclosure relates to a solid state power controller and an aircraft.

BACKGROUND

In recent years, electricity gained increasing importance as a form of energy for driving air vehicles. This includes, in particular, electric aircrafts with vertical take-off and landing functionality (eVTOL).

A crucial component for electric (i.e., electrically driven/electrically propelled) aircrafts, including eVTOL, is an appropriate power controller controlling power supplied by a power source to loads like a propulsion unit or a plurality of propulsion units, in particular, electric propulsion units (EPUs).

Generally speaking, power controllers are devices that control power (voltage and/or current) supplied to a load. They perform supervisory and diagnostic functions in order to identify overload conditions, to detect short circuits and interrupt the power flow. In this respect, it is desirable to interrupt the power flow in a case of a short circuit as fast as possible in order to limit potential damage. Further, power controllers may limit a current during startup of capacitive loads, protect the loads and the wiring from overcurrent, and switch off loads for maintenance purposes.

Current solutions that fulfill these functionalities either consist of a series connection of an electromechanical switch (a contactor) and an overcurrent protection system like a thermal fuse. This solution has a high mechanical complexity, a high mass and a low efficiency. In addition, the solution may be prone to ageing effects due to moving parts, to contact erosion due to arcing and/or to fatigue due to thermomechanical stress. Therefore, close monitoring and potentially lifetime maintenance is required.

Conventional solid state power controllers (SSPC) are semiconductor devices, which are similar to electronic circuit breakers in that they protect loads from dangerous faults, but may be more reliable and faster at switching the power off. SSPCs comprise programmable microprocessors that allow control via digital busses and flexible adjustment of current/time characteristics. Current solutions involving solid state power controller systems rely on complex electronics for safety critical functions such as overcurrent protection, requiring redundancy and dissimilarity.

As it is generally the case with respect to air traffic, highest safety standards are applicable to the components of aircrafts, including power controllers like SSPCs, power sources and loads (EPUs). However, due to conventional SSPCs' complexity, they may be subject to numerous failure conditions, including, but not limited to, software bugs, hidden design or manufacturing defects or faulty maintenance measures.

In order to ensure safe operation during flight and on the ground, failures of SSPCs within an aircraft should be detected and dealt with in a manner maximizing safety, wherein the primary function of an aircraft, namely maintaining a safe state during flight, should be maintained as far as possible.

It is thus a crucial task during the design of a power controller, in particular, for application within an aircraft, that the risk of failure of any component is minimized, their reliability is high and maintenance requirements are reduced.

BRIEF SUMMARY

The present disclosure aims to provide a power controller exhibiting a high reliability, a low risk of failure, low maintenance requirements and low ageing effects.

This is achieved by the features of the independent claims. The dependent claims describe advantageous embodiments.

According to a first aspect, a solid state power controller (SSPC) is provided. The solid state power controller comprises a power supply line configured to be connected between a power source and a load. Further, the solid state power controller comprises a semiconductor switching unit provided on the power supply line and configured to switch between at least two states according to a command signal. The at least two states include a conducting state and a non-conducting state. Further the solid state power controller comprises a state machine, which is configured to exhibit at least two states, including an ON state and an OFF state. The state machine is further configured to output the command signal according to a current state of the state machine.

In other words, the SSPC is configured to be provided on a power line connecting the power source and the load. The state machine exhibits at least two states, according to which the semiconductor switching unit is controlled using the command signal. Specifically, the semiconductor switching unit may electrically connect the power source and the load if it is operated in the conducting state. On the other hand, the semiconductor switching unit interrupts an electric connection between the power source and the load in a case where the semiconductor switching unit is operated in the non-conducting state. The state machine exhibits at least two states, namely the ON state and the OFF state and allows for transitions between the states of the state machine.

The states of the semiconductor switching unit may be referred to as switch states, to distinguish the switch states from the states of the state machine.

The conducting state of the semiconductor switching unit may be a state where the electric resistance through the semiconductor switching unit is below a first threshold. The non-conducting state may be a state where the electric resistance through the semiconductor switching unit is above a second threshold.

It is noted that the number of states of the state machine is not limited to two states, but may be three, four or higher. Generally speaking, the state machine may exhibit a plurality of states, including the ON state and the OFF state. The semiconductor switching unit is controlled by the command signal, which is output by the state machine according to its current state. The command signal may indicate the state to be transitioned to by the semiconductor switching unit or cause the semiconductor switching unit to enter the conducting state or the non-conducting state according to the command signal.

The configuration of the SSPC may allow for certification as electronics hardware per ARP4754A: "Guidelines for Development of Civil Aircraft and Systems," December 2010, https://www.sae.org/standards/content/arp4754a/.

In addition or alternatively, the configuration of the SSPC may allow for certification as "simple hardware" according to "RTCA DO-254/EUROCAE ED-80, Design Assurance Guidance for Airborne Electronic Hardware" dated Apr. 19, 2000, from RTCA, Inc., http://www.rtca.org/.

Further, a lower equipment mass and therefore an increased payload, less maintenance cycles and a reduction in certification effort during a development process and therefore faster progress toward entry into service may be achieved by the disclosure.

According to an embodiment, the state machine is a non-programmable logic part formed by a plurality of non-programmable electronic components. The semiconductor switching unit is formed by one or more non-programmable electronic components.

A non-programmable electronic component may be an electronic component whose characteristics and behavior within an electric circuit is determined by its hardware configuration only. In other words, the characteristics and behavior of a non-programmable electronic component cannot be defined by software or firmware.

Non-programmable electronic components include amplifiers, comparators and other analog components like multipliers, current sensors, voltage transducers, temperature sensors and isolated signaling components like digital isolators, isolated amplifiers or opto-couplers. Further, non-programmable electronic components include linear and switching voltage regulators, oscillators, logic gates, buffers, flip-flops, registers and latches as well as analog to digital converters and voltage references. The series of examples is non-exhaustive.

The state machine may be formed by non-programmable components and, hence, may be a hardware device for which a comprehensive combination of deterministic test and analyses appropriate to a certain development assurance level can ensure correct functional performance under all foreseeable operating conditions with no anomalous behavior. A logic part may be also called a logic circuit.

The SSPC provides a power control functionality with a safe state ON loss of communication, sensing or monitoring. It may provide an overcurrent protection functionality based on a simple current sensing and non-programmable components for current time characteristics.

The use of non-programmable electronics to implement the safe state ON using complex/programmable electronics only for monitoring and communication functionality may allow for deterministic behavior of critical parts of the system, thereby simplifying testing and certification.

In an embodiment, the command signal indicates the semiconductor switching unit to be in the non-conducting state if the current state of the state machine is the OFF state. Further, the command signal indicates the semiconductor switching unit to be in the conducting state if the current state of the state machine is the ON state.

In other words, the semiconductor switching unit is controlled to electrically connect the power source and the load when the state machine's current state is the ON state and to electrically interrupt the connection between the power source and the load when the state machine's current state is the OFF state.

In an embodiment, the solid state power controller comprises a current sensor, which is provided on the power supply line and configured to detect a current. Further, the solid state power controller comprises an overcurrent detection unit, which is configured to detect an overcurrent using the current detected by the current sensor. The state machine is configured to change the current state based on a detection result of the overcurrent detection unit.

In other words, the current sensor measures a current flowing through the power supply line and provides a measurement signal to the overcurrent detection unit. The overcurrent detection unit determines whether or not an overcurrent condition is satisfied. According to a determination result, the state machine may change its current state. For instance, the state machine may be configured to transition to the OFF state in a case where an overcurrent has been detected by the overcurrent detection unit. For example, the state machine may transition from the ON state or another state to the OFF state in a case of a detected overcurrent. If the current state of the state machine is the OFF state and an overcurrent is detected by the overcurrent detection unit, the state machine may maintain its current state, i.e., the OFF state.

In an embodiment, the solid state power controller comprises a current sensor provided on the power supply line and configured to detect a current; and an overcurrent detection unit configured to detect an overcurrent using the current detected by the current sensor. The state machine may be configured to transition to the OFF state if an overcurrent is detected by the overcurrent detection unit.

For instance, the overcurrent detection unit is configured to detect the overcurrent by integrating a square of the detected current for a predetermined period and comparing the integration result with an integration threshold.

In other words, the overcurrent detection unit may mimic the behavior of a fuse exhibiting a specific $I^2t$ characteristic. An $I^2t$ rating is related to the amount of energy led through a respective electric component. The overcurrent detection unit may be configured to determine that there is an overcurrent flowing through the power supply line if the integration result is above the integration threshold.

According to an embodiment, the solid state power controller further comprises a temperature sensor, which is configured to detect a temperature of the solid state power controller and to output a temperature signal indicating the detected temperature to the state machine. The state machine may be configured to change the current state based on the temperature signal.

In other words, the state machine may change the current state using a temperature measurement signal output by the temperature sensor. For instance, the measurement signal may be compared to a temperature threshold. In a case where the temperature is above the temperature threshold, the state machine may be configured to transition to the OFF state. If the current state is the OFF state and the temperature is above the temperature threshold, the state machine may be configured to maintain the current state, i.e., the OFF state.

The temperature sensor may be provided at any suitable location. For instance, the temperature sensor may measure a temperature of one specific component of the SSPC like the semiconductor switching unit.

In an embodiment, the solid state power controller comprises a temperature sensor configured to detect a temperature of the solid state power controller and to output a temperature signal indicating the detected temperature to the state machine, wherein the state machine is configured to transition to the OFF state if the temperature indicated by the temperature signal is above a temperature threshold.

According to an embodiment, the solid state power controller further comprises a voltage sensor, which is configured to detect a voltage downstream of the semiconductor switching unit and to output a voltage signal indicating the detected voltage to the state machine. The state machine may be configured to change the current state based on the voltage signal.

In other words, the state machine may change the current state using a voltage measurement signal output by the voltage sensor. For instance, the measurement signal may be compared to a voltage threshold. In a case where the voltage is above the voltage threshold, the state machine may be configured to transition to the OFF state. If the current state is the OFF state and the voltage is above the voltage threshold, the state machine may be configured to maintain the current state, i.e., the OFF state.

A voltage sensor may be provided at any suitable location. For instance, a voltage sensor may be provided to measure a voltage across the semiconductor switching unit, for instance.

In an embodiment, the solid state power controller comprises a voltage sensor configured to detect a voltage of the power supply line downstream of the semiconductor switching unit and to output a voltage signal indicating the detected voltage to the state machine, wherein the state machine is configured to transition to the OFF state if the voltage indicated by the voltage signal is above a voltage threshold.

In an embodiment, the states of the semiconductor switching unit further include an intermediate state, wherein the semiconductor switching unit is configured to limit a current on the power supply line, according to the command signal, to below a predetermined current threshold. The command signal indicates the semiconductor switching unit to be in the intermediate state if the current state of the state machine is a pre-charge state.

In other words, the states of the state machine include the conducting state, the non-conducting state and the intermediate state, which allows for a certain current flowing through the power supply line and, hence, the semiconductor switching unit. Further, the state machine exhibits, in addition to the ON state and the OFF state, at least a pre-charge state. In the pre-charge state, a command signal is output by the state machine to the semiconductor switching unit, causing the semiconductor switching unit to limit the current flowing therethrough.

For example, the state machine may be configured to transition from the pre-charge state to the ON state when a voltage across the semiconductor switching unit is below a pre-charge voltage and/or when a current through the semiconductor switching unit is below a pre-charge current threshold.

In an embodiment, the semiconductor switching unit limits the current on the power supply line by exhibiting an electrical resistance according to the command signal.

In other words, the intermediate state may be a state where the semiconductor switching unit exhibits an electrical resistance in between above-mentioned first and second threshold. The current flowing through the power supply line and, hence, the SSPC and, in particular, the semiconductor switching unit, is limited by the electrical resistance exhibited by the switching unit.

In an embodiment, the intermediate state is a state where the semiconductor switching unit alternatingly switches between the conducting and the non-conducting state, thereby limiting the current flowing through the semiconductor switching unit on average over time.

According to an embodiment, the semiconductor switching unit is a metal oxide semiconductor field effect transistor, MOSFET. A source terminal and a drain terminal of the MOSFET may be connected to the power supply line. A gate terminal of the MOSFET may be connected to the state machine.

For instance, the MOSFET is a p-type or n-type enhancement MOSFET.

For instance, the state machine may be configured to output the command signal to the gate terminal of the MOSFET.

In an embodiment, the solid state power controller further comprises circuitry, which is connected to the state machine. The circuitry is configured to monitor the state of the state machine, the current detected by the current sensor, the state of the semiconductor switching unit, the temperature detected by the temperature sensor, and/or the voltage detected by the voltage sensor. Further, the circuitry may be configured to output a vehicle command signal to the state machine. The vehicle command signal may indicate a state to be transitioned to by the state machine.

In other words, the SSPC comprises circuitry, which monitors readings of dedicated sensors like a voltage, current or temperature sensor. Further, the circuitry may monitor the current state of the state machine and/or the state of the semiconductor switching unit. For this purpose, the circuitry may be connected to respective sensors and/or components (the state machine, the semiconductor switching unit, etc.)

In an embodiment, the circuitry may be configured to be connected to an external communication line and configured to perform communication via the external communication line.

In other words, the semiconductor switching unit may be connected to an external communication line like a bus and perform communication with one or more external devices. For instance, the circuitry may perform communication with a flight control system (FCS) and receive command signals, transmit report signals and the like. For instance, the circuitry may receive a command signal from an external FCS and output a vehicle command signal to the state machine according to the received command signal.

According to a second aspect, an aircraft is provided. The aircraft comprises a solid state power controller according to the first aspect or any one of its embodiments, the power source, and the load.

The aircraft may be a vehicle able to fly by gaining support from the air using either static or dynamic lift. The aircraft may be any aircraft, including, but not limited to, a fixed-wing aircraft like a plane, a rotary-wing aircraft like a helicopter, or the like. The load may be a propulsion unit, in particular, an electrical propulsion unit like an electrical fan, a propeller or a ducted fan.

Preferably, the aircraft is an electric vertical take-off and landing aircraft, eVTOL.

BRIEF DESCRIPTION OF THE DRAWINGS

Additional features and advantages of the present disclosure will become apparent in the following and more particular description as illustrated in the accompanying drawings, wherein.

DETAILED DESCRIPTION

The present disclosure relates to a solid state power controller (SSPC), which may be used in electrically driven aircrafts, for example. The SSPC comprises a state machine and a semiconductor switching unit, which may connect or interrupt an electrical connection of a power supply line through the semiconductor switching unit according to a state of the state machine.

Figure 1:
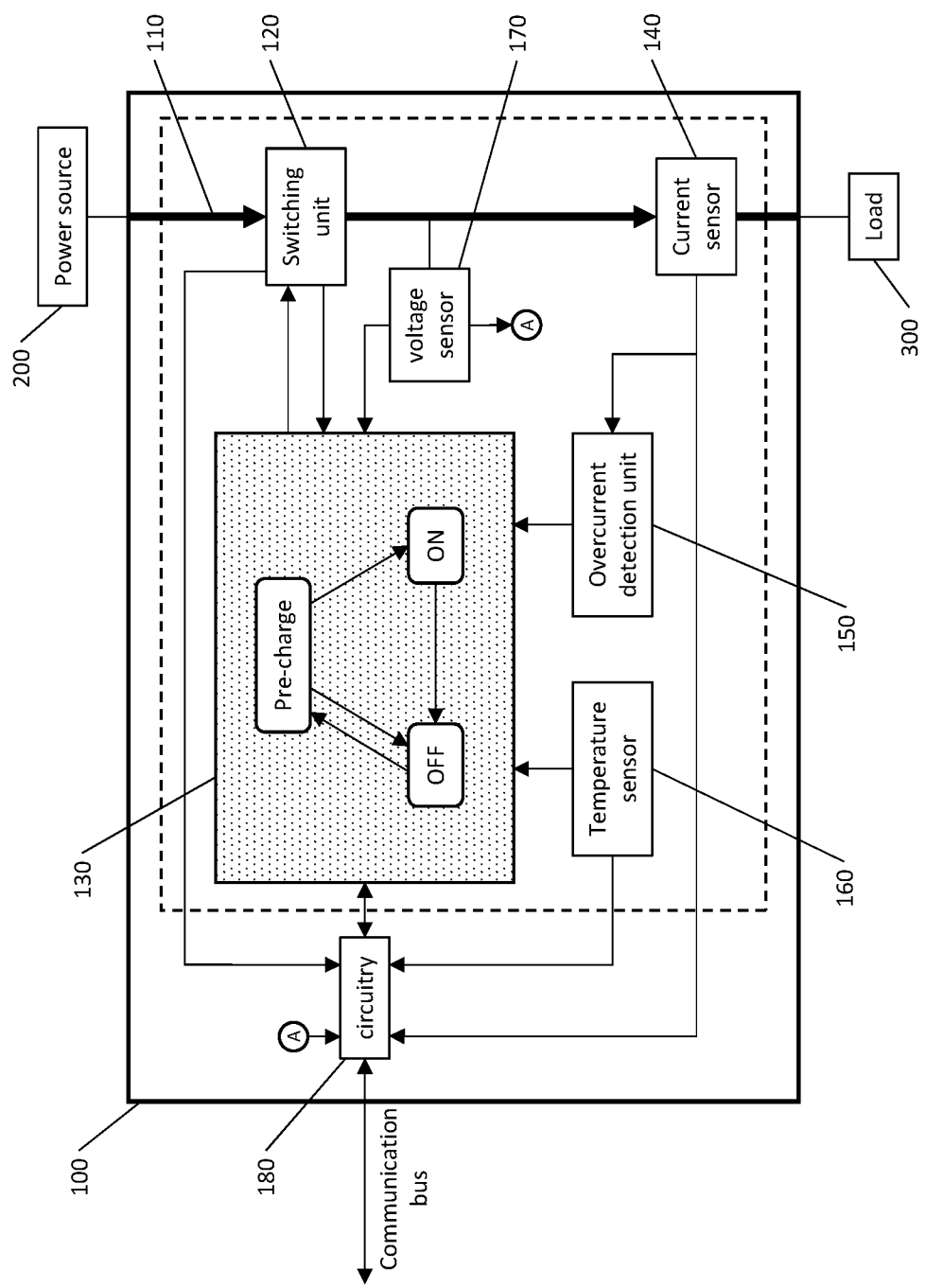
FIG. 1 is a schematic structural illustration of a solid state power controller according to an embodiment.

FIG. 1 is a schematic structural illustration of an SSPC according to an embodiment. The SSPC 100 comprises a power supply line 110, which is configured to be connected to a power source 200 and a load 300. On the power supply line 110, a semiconductor switching unit 120 is provided. Further, a current sensor 140 configured to measure a current flowing through the power supply line 110 is provided on the power supply line 110. Additionally, the SSPC 100 comprises a voltage sensor measuring a voltage on the power supply line 110, for instance, downstream of the semiconductor switching unit 120. The voltage sensor may (in addition or alternatively) measure a voltage across the MOSFET 120. Further, the SSPC 100 comprises an overcurrent detection unit 150, a temperature sensor 160, a voltage sensor 170 and a state machine 130. The SSPC 100 may further comprise circuitry 180, which may communicate via an external communication line like a bus.

The components within the section of the SSPC indicated by the dashed line may be formed by a plurality of non-programmable electronic components, as defined further above. The circuitry may be programmable and may be, for instance, a microcontroller or microprocessor.

The semiconductor switching unit 120 is an enhancement-type metal-oxide-semiconductor field-effect transistor (MOSFET), whose drain and source terminals are connected to the power supply line 110. The gate terminal of the MOSFET 120 is connected to the state machine 130. The MOSFET 120 exhibits a conducting state, an intermediate state and a non-conducting state according to a command signal provided by the state machine 130 and input to the gate terminal of the MOSFET 120. The MOSFET 120 may be operated in the conducting state, the non-conducting state or the intermediate state according to the voltage applied to its gate terminal. In the intermediate state, the MOSFET 120 may be operated in its linear regime.

The voltage sensor 170 senses a voltage on the power supply line 110, for instance, downstream of the MOSFET 120. However, the voltage sensor 170 may be configured to measure a voltage drop across a certain electronic component like the MOSFET 120. The voltage sensor 170 outputs a signal indicating the detected voltage to the state machine 130 and the circuitry 180.

The current sensor 140 is provided on the power supply line 110 and outputs a current signal indicating a current flowing through the power supply line 110 to the overcurrent detection unit 150 and the circuitry 180.

The overcurrent detection unit 150 is configured to determine whether or not there is an overcurrent occurring on the power supply line 110. The overcurrent detection unit 150 may be a simple comparator configured to compare the current signal output by the current sensor 140 with a reference signal and determine that there is an overcurrent in a case where the current signal is higher than the reference signal. Alternatively, the overcurrent detection unit 150 may integrate a square of the current signal over a predetermined period and compare the integration result with a (different) reference signal. In a case where the integration result is higher than the reference signal, on overcurrent may be determined to have occurred. The overcurrent detection unit 150 is configured to output an overcurrent signal to the state machine indicating whether or not an overcurrent has been detected. A specific implementation of an overcurrent detection unit 150 is described below with reference to FIG. 6.

The temperature sensor 160 is configured to measure a temperature of the SSPC 100 and to output a corresponding temperature signal to the state machine 130 and to the circuitry 180.

The circuitry 180 is connected to the state machine 130, each of the temperature sensor 160, the overcurrent detection unit 150, the current sensor 140, the voltage sensor 170, the MOSFET 120 and/or an external communication line. The circuitry 180 is configured to monitor the reading of the sensors as well as the states of the state machine 130 and of the MOSFET 120. For instance, the circuitry 180 may transmit messages via the external communication line indicating any of the monitored values. Further, the circuitry 180 may receive a command message via the external communication line, for instance, from a flight control system (FCS), and output a vehicle command to the state machine 130 indicating a state the state machine 130 should transition to.

The state machine 130 is connected to the temperature sensor 160, the overcurrent detection unit 150, the voltage sensor 170, the semiconductor switching unit 120 and the circuitry 180. The state machine exhibits three states, namely an ON state, an OFF state and a pre-charge state. The current state of the state machine 130 is determined by the readings of the voltage sensor 170, the input signal of the overcurrent detection unit 150, the temperature signal provided by the temperature sensor 160, and a vehicle command, which may be input by the circuitry 180. The state machine 130 is configured to control the MOSFET 120 to be operated in the conducting state, the intermediate state or the non-conducting state according to the current state of the state machine 130.

In the ON state, the MOSFET 120 is controlled to be within the conducting state, thereby allowing a current to flow through the power supply line 110. In the OFF state, the MOSFET 120 is controlled to be within the non-conducting state, thereby preventing a current to flow through the power supply line 110. In the pre-charge state, the MOSFET 120 is controlled so as to limit a current flowing through the power supply line 110. For instance, the MOSFET 120 is operated in its linear regime when the state machine is within the pre-charge state. A limitation of a current flowing through the power supply line 110 may be necessary in a case where the load exhibits a large capacitance, thereby causing an initially large current (inrush current) through the power supply line 110.

The state machine 130 allows for transitions between the ON state, the OFF state and the pre-charge state. Specifically, the state machine 130 may transition from the OFF state to the pre-charge state and vice versa. Further, the state machine may transition from the pre-charge state to the ON state and from the ON state to the OFF state. Each transition is determined by the various inputs to the state machine 130.

For instance, if a vehicle command indicating the state machine 130 to transition to the pre-charge is input to the state machine 130 whose current state is the OFF state, the state machine 130 transitions from the OFF state to the pre-charge state. In a case where an overcurrent is detected by the overcurrent detection unit 150, the state machine 130 transitions to the OFF state, either from the pre-charge state or from the ON state. The same may apply in a case where the temperature detected by the temperature sensor 160 is above a certain temperature threshold and/or in a case where the voltage detected by the voltage sensor 170 is above a voltage threshold. In a case where the current state of the state machine 130 is the pre-charge state, the state machine 130 may transition to the ON state in a case where a voltage drop across the MOSFET 120 (i.e., across the drain and source terminals) is below a pre-charge voltage threshold or the current through the MOSFET 120 is below a pre-charge current threshold. For measuring the voltage drop, the SSPC 100 may comprise a dedicated voltage sensor.

In particular, the state machine 130 as well as the other components (other than the circuitry 180) may be formed by a plurality of non-programmable electronic components. Specific implementations thereof are described in the following.

Figure 2:
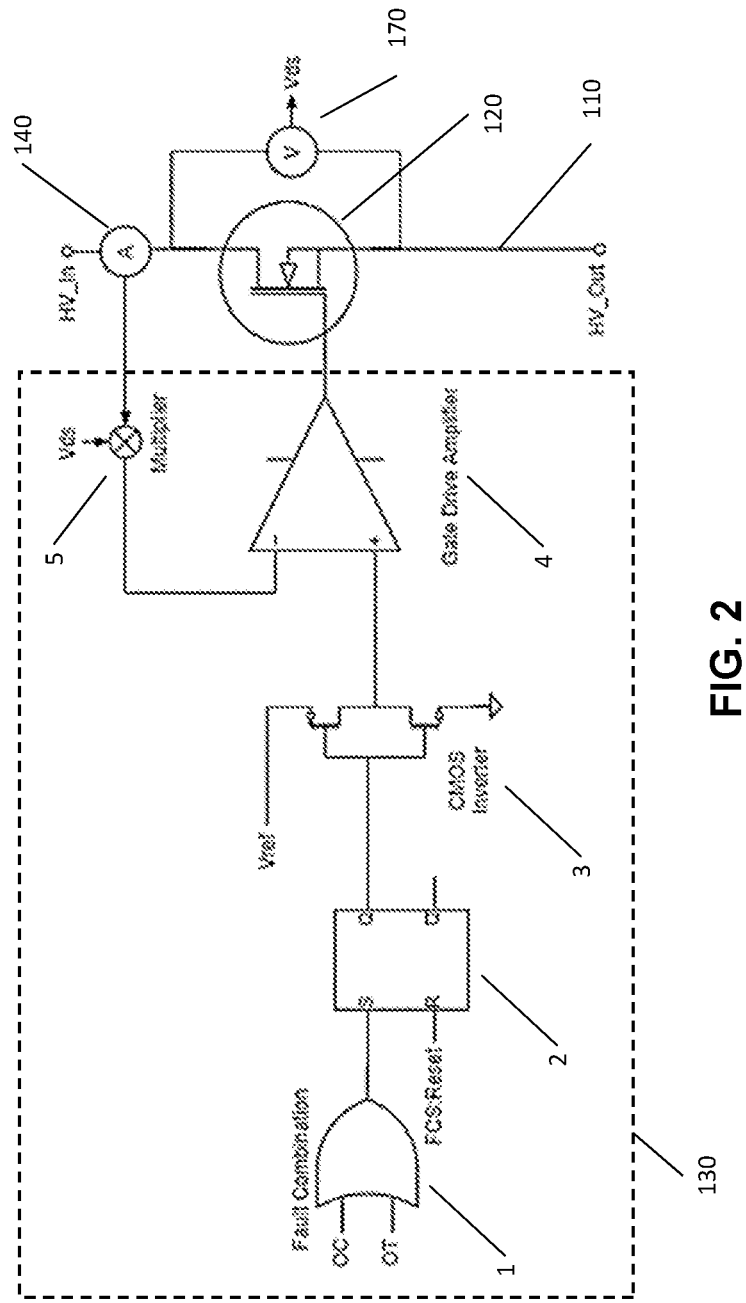
FIG. 2 is a schematic illustration of an implementation example of a solid state power controller according to an embodiment.

FIG. 2 is a schematic illustration of an implementation example of a solid state power controller 100 according to an embodiment. The state machine 130, indicated by the dashed rectangle, is a non-programmable logic part including an OR-gate 1, a latch 2 (a flip-flop), a CMOS inverter 3, a gate drive amplifier 4 and a multiplier 5. Further, the SSPC 100 comprises the current sensor 140, the voltage sensor 170 and the power supply line 110.

An overcurrent (OC) signal and an overtemperature (OT) signal are input to the OR gate. The OC signal may be provided by the overcurrent detection unit 150 and may indicate an overcurrent condition by a logical true (high value) and the absence of an overcurrent by a logical false (low value/zero). The signal provided by the temperature sensor 160 may be input to a comparator, which provides the OT temperature using a reference signal for comparison with the signal provided by the temperature sensor 160. The OT signal may indicate logical true in case of an overtemperature condition. The output signal of the OR gate 1 indicates true if one or both of the OC and the OT signals indicates true.

The output of the OR gate 1 is input to the Set input (S) of the latch 2. An FCS:Reset signal may be input by the circuitry 180 (according to a command received via the external communication line from a flight control system (FCS)) to the Reset input (R) of the latch 2. The non-inverting output Q of the latch is connected to the input of the CMOS inverter 3. Hence, if an OC and/or an OT has occurred (and the latch 2 has not been reset by the FCS), a signal indicating true is output to the CMOS inverter 3 and, if no OC or OT has occurred, a signal indicating false is input to the CMOS inverter 3.

Depending on the CMOS inverter input signal, either a reference voltage Vref or zero is input to the non-inverting input of the gate drive amplifier 4. The power dissipated in the MOSFET 120 is calculated by a multiplier 5 based on the voltage measured across the MOSFET 120 by the voltage sensor 170 and the current flowing through the MOSFET 120 measured by the current sensor 140. The output signal of the multiplier, which is proportional to the power dissipation within the MOSFET 120 is input to the inverting terminal of the gate drive amplifier 4.

The gate drive amplifier 4 amplifies the difference between the output of the CMOS inverter 3 and the multiplier 5 and outputs the amplified signal to the gate electrode of the MOSFET 120. The gate drive amplifier's 4 output signal minimizes the difference of the input signals. Hence, in a case where the output of the CMOS inverter 3 is zero, i.e., an OC and/or OT has occurred, the power dissipation in the MOSFET 120 is minimized. If no OT or OC has occurred, the reference voltage Vref is applied to the inverting input of the gate drive amplifier 4. The reference voltage Vref is a predetermined voltage and corresponds to a maximum power dissipation of the MOSFET 120 in order to limit a current through the power supply line 110. For instance, the reference voltage may be set to a voltage corresponding to a specific power dissipation of 160 W.

Hence, the state machine 130 according to the implementation example exhibits an OFF state, which is the current state when an error has occurred, and a combined pre-charge and ON state when no failure (OC, OT) has occurred. In the pre-charge/ON state the maximum power dissipation in the MOSFET 120 is determined by the reference voltage Vref. That is, in the pre-charge/ON state, the power dissipation within the MOSFET 120 is limited and, hence, a potentially occurring inrush current is prevented.

Figure 3:
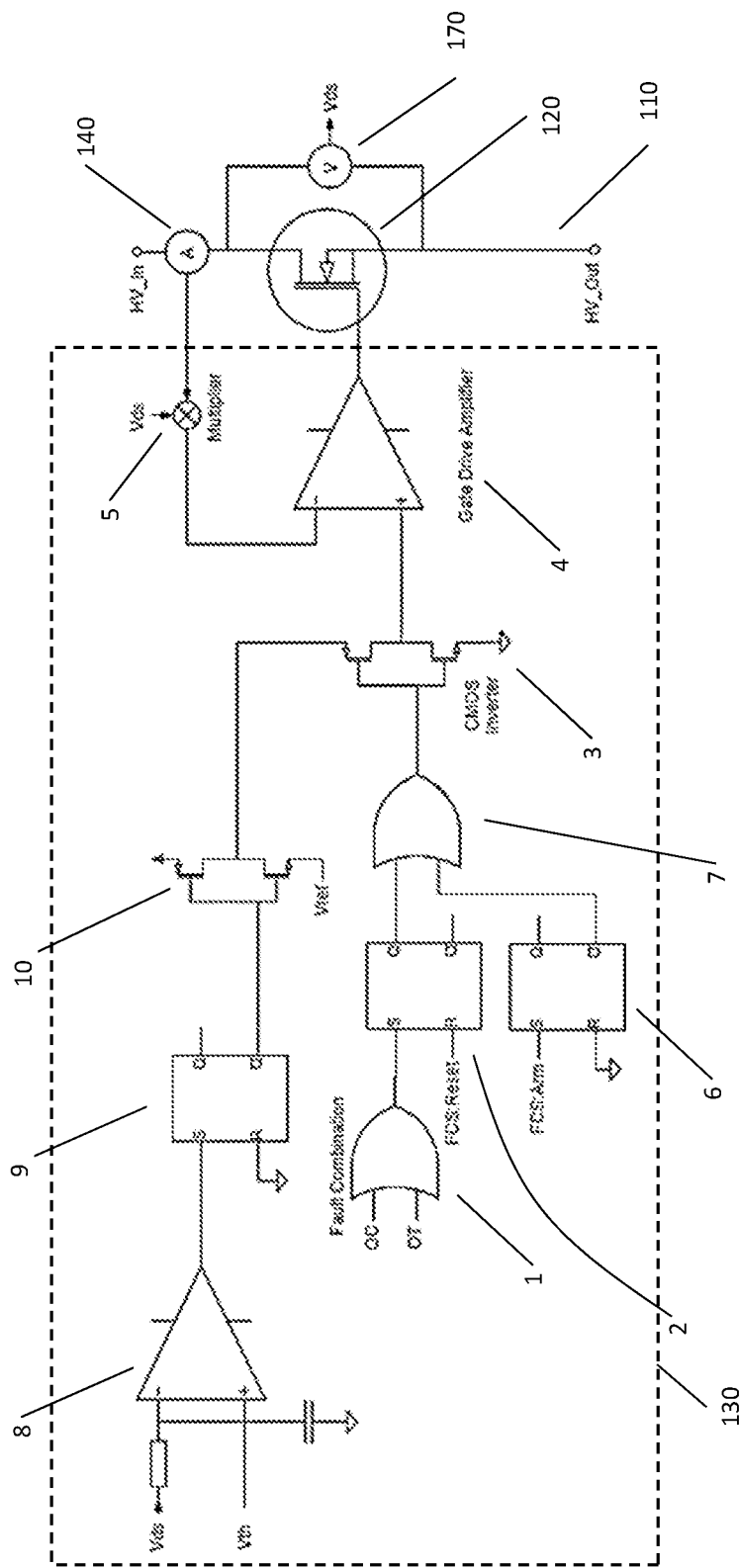
FIG. 3 is a further schematic illustration of an implementation example of a solid state power controller according to an first embodiment.

FIG. 3 is a schematic illustration of an implementation example of a solid state power controller according to another embodiment. Components of the SSPC illustrated in FIG. 3 equal to the components of the SSPC as illustrated in FIG. 2 are indicated with the same reference numerals and above-given descriptions equally apply.

The SSPC 100 illustrated in FIG. 3 differs from the SSPC 100 illustrated in FIG. 2 by the second latch 6, the second OR gate 7, the comparator 8, the third latch 9 and the second CMOS inverter 10.

A vehicle command FCS:Arm may be input to the S input of the second latch 6. The vehicle command may be input by the circuitry 180 (not illustrated) based on a command transmitted from an FCS via the external communication line. As will be shown in the following, the state machine 130 remains within an OFF state until the FCS:Arm vehicle command is being received. The inverting output of the second latch 6 is connected to an input of the second OR gate 7. Further, the output of the (first) latch 2 is input to the other input of the second OR gate 7. That is, the output of the second OR gate 7 is a signal indicating true if an OC/OT has occurred and/or the FCS:Arm command has not yet been input to the second latch 6. That is, the input to the non-inverting terminal of the gate drive amplifier 4 is zero if an OT/OC has occurred or the state machine 130 has not been instructed to enter the pre-charge state by the FCS:Arm command.

When the FCS:Arm command has been input to the second latch 6 and no OT/OC has occurred, the output of the CMOS inverter 3 is equal to the output of the second CMOS inverter 10. Accordingly, the power dissipation within the MOSFET 120 is controlled so as to correspond to the voltage output by the second CMOS inverter 10, which is either the reference voltage Vref or a positive supply power voltage, depending on the input to the second CMOS inverter 10. The input to the second CMOS inverter 10 depends on whether the voltage across the MOSFET 120 has fallen below a voltage threshold Vth. Vth is a predetermined threshold voltage, which is input to the non-inverting input of the comparator 8. The voltage Vds across the MOSFET 120 is input (via a low-pass filter, for instance) to the inverting input of comparator 8. If Vds is larger than Vth, a signal indicting true is input to the third latch 9, causing a signal indicating false to be input to the second CMOS inverter 10, causing Vref to be applied to the gate drive amplifier 4. In a case where Vdc drops below Vth, the positive supply power is input to the gate drive amplifier 4.

Summarizing, the SSPC according to the embodiment exhibits an OFF state in a case where FCS:Arm has not been received and/or an OT/OC has occurred, wherein the power dissipation in the MOSFET 120 is controlled to be zero. Further, the SSPC 100 exhibits a pre-charge state, wherein Vds is above Vth and FCS:Arm has been received, wherein the power dissipation within the MOSFET 120 is controlled according to the reference voltage Vth. As soon as Vds drops below Vth, the SSPC 100 enters the ON state, wherein the power dissipation in the MOSFET 120 is controlled according to the positive power supply voltage.

In other words, the MOSFET 120 is controlled to be in a conducting state if the current state is the ON state, in a non-conducting state if the current state is the OFF state, and in an intermediate state wherein the power dissipation within the MOSFET 120 is controlled not to exceed a threshold if the SSPC 100 is in the pre-charge state. In particular, in a case where an OC/OT has occurred, the SSPC 100 transitions to the OFF state. Further, although the SSPC 100 may be controlled by the circuitry 180 to enter the pre-charge state (by providing FCS:Arm), the circuitry 180 cannot cause the SSPC 100 to perform any other transition.

Figure 4:
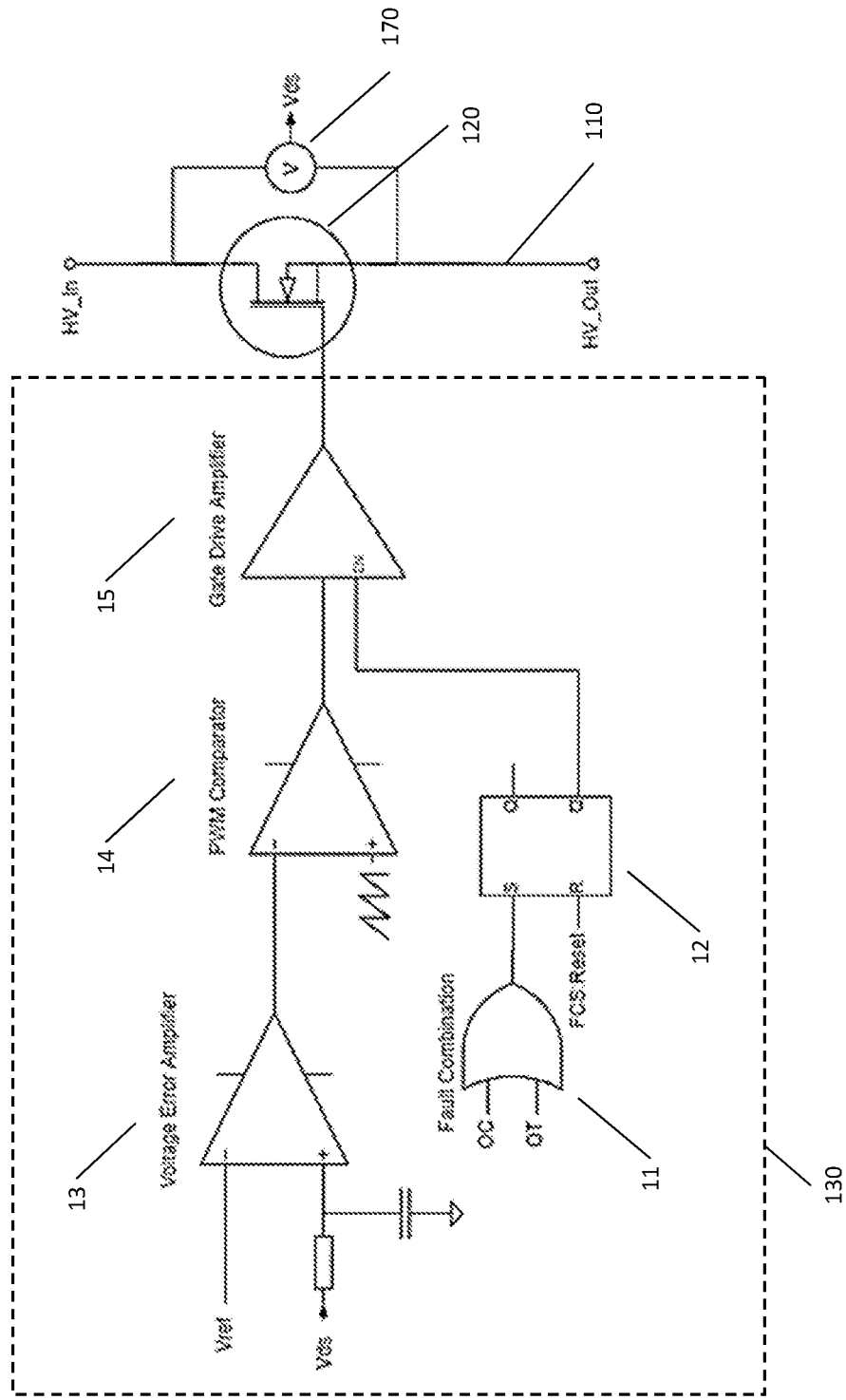
FIG. 4 is a further schematic illustration of an implementation example of a solid state power controller according to an first embodiment.

FIG. 4 is a schematic illustration of an implementation example of a solid state power controller 100 according to another embodiment. In the embodiment, the current is limited in the pre-charge state by operating the MOSFET 120 using pulse width modulation. The state machine 130 comprises an OR gate 11, a latch 12, a voltage error amplifier 13, a PWM comparator 14, and a gate drive amplifier 15 with protective features. Protective features like desaturation detection or soft turn-off are commonly known for components driving insulated-gate bipolar transistors, for instance. Certain implementations may make use of a Miller clamp or an undervoltage lockout (UVLO).

As in the embodiments described with reference to FIG. 2 and FIG. 3, an overcurrent (OC) signal and an overtemperature (OT) signal is input to the OR gate 11, whose output is input to the latch 12 S input. An FCS:reset signal may be input to the R input of the latch 12. The FCS:reset signal may be provided by the circuitry 180. The inverted output signal of the latch 12 is input to a protective input (EN) of the gate drive amplifier 15. The gate drive amplifier 15 is configured to output zero in a case where a signal indicating false is input to the protective input (EN).

In order to prevent unintentional resetting of the state machine 130 by the circuitry 180 due to a failure causing FCS:reset to be permanently provided, the output of the circuitry 180 may be prevented from being input to the state machine 130 unless a certain amount of time has passed since a previous FCS:reset command. For this purpose, the SSPC 100 may comprise a timer circuit connected between the circuitry 180 and the state machine 130. The FCS:reset command may be input to the timer circuit, which is configured to output the FCS:reset command to the state machine 130 only when a predetermined amount has passed from a previous FCS:reset command. When the FCS:reset command is output by the timer circuit, the timer circuit may be reinitiated.

A reference voltage Vref and a voltage Vds measured across the MOSFET 120 by the voltage sensor 170 are input the voltage error amplifier 13. The reference voltage Vref may be predetermined, for instance. The output of the voltage error amplifier 13, i.e., an amplified difference between Vds and Vref is input to the inverting input of the PWM comparator 14. A sawtooth voltage signal is input to the non-inverting input of the PWM comparator 14.

The output of the PWM comparator 14 is hence a pulsed signal, wherein its duty cycle depends on the difference between Vref and Vds. In a case where the amplified difference is equal to or above the peak voltage of the sawtooth voltage signal, zero is output by the comparator. In a case where the amplified difference is equal to or below the minimum voltage of the sawtooth voltage signal, a constant signal is output by the PWM comparator 14. Further, in a case where the amplified difference is in between the minimum and the maximum voltage of the sawtooth voltage signal, a pulsed signal is output, wherein the pulse width increases as the amplified difference decreases.

The output of the PWM comparator 14 is input to the gate drive amplifier 15, which amplifies the signal and outputs the amplified signal to the gate terminal of the MOSFET 120. Hence, the MOSFET 120 is controlled to be in the conducting or non-conducting state depending on the value of the signal output by the gate drive amplifier 15. Specifically, if Vds is larger than Vref and at the same time the amplified difference therebetween is equal to or above the maximum of the sawtooth voltage signal, the MOSFET is controlled to be in the non-conducting state. If Vds is equal to or larger than Vref and at the same time the amplified difference therebetween is below the maximum of the sawtooth voltage signal, the MOSFET 120 is controlled in a pulsed manner, causing the MOSFET 120 to be in the conducting and the non-conducting states in an alternating manner. If Vds is below Vref, the MOSFET 120 is controlled to be continuously in the conducting state.

Thus, summarizing, the SSPC 100 comprising the state machine 130 as described above exhibits three states (OFF, ON, pre-charge), wherein the MOSFET is in the conducting state, the non-conducting state, or an intermediate state, wherein the MOSFET switches between the conducting and the non-conducting state according to above-described PWM.

Figure 5:
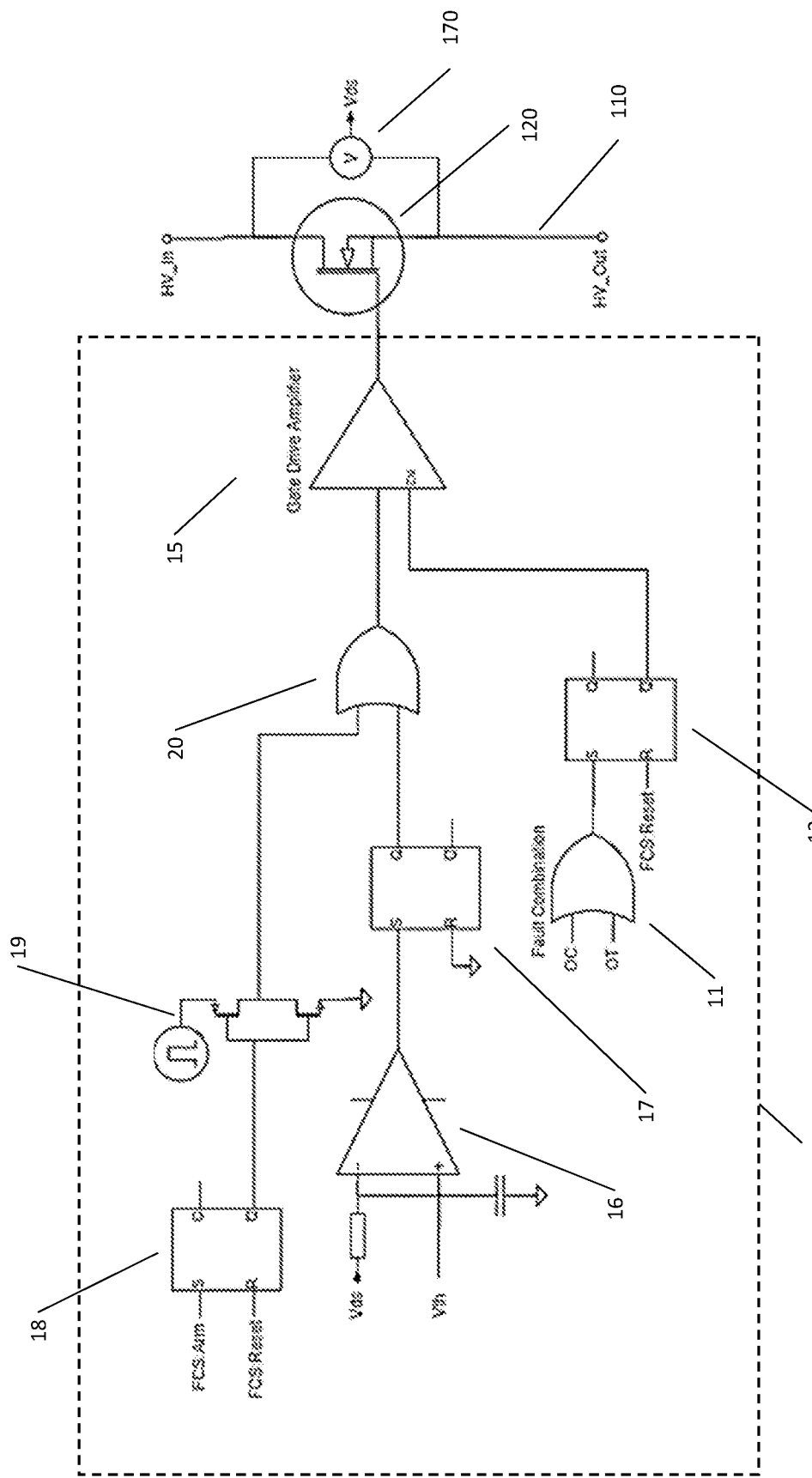
FIG. 5 is a further schematic illustration of an implementation example of a solid state power controller according to an first embodiment.

FIG. 5 is a schematic illustration of an implementation example of a solid state power controller according to another embodiment. Components of the SSPC 100 illustrated in FIG. 5 equal to the components of the SSPC 100 as illustrated in FIG. 4 are indicated with the same reference numerals and above-given descriptions equally apply.

The state machine 130 comprises a first OR gate 11, a first latch 12, a comparator 16, a second latch 17, a third latch 18, a CMOS inverter 19, a second OR gate 20 and a gate drive amplifier 15 having protective features.

A voltage Vds across the MOSFET 120 measured by the voltage sensor 170 is input (via a low pass filter, for instance) to the inverting input of the comparator 16. A predetermined threshold voltage Vth serves as input to the non-inverting input of the comparator 16. The output of the comparator 16 is a signal indicating true in a case where Vds is below Vth. On the other hand, in a case where Vds is larger than Vth, zero is output by the comparator 16. The output of the comparator is input—via the latch 17—to the second OR gate 20.

A vehicle command FCS:Arm may be input so the S input of the third latch 18 and a vehicle commend FCS:Reset may be input to the R input of the third latch. The output signal of the inverting output terminal of the third latch 18 is input to the CMOS inverter 19. Depending on whether the output signal, either zero or a pulsed signal is output by the CMOS inverter 19 to the second OR gate 20. The pulsed signal may be input to the CMOS inverter 19 from a circuit as described above with reference to FIG. 4, comprising the voltage error amplifier 13 and the PWM comparator 14. The output of the second OR gat is input to the gate drive amplifier 15, which controls the MOSFET 120 accordingly.

Hence, when the FCS:Arm vehicle command is provided, the pulsed signal is input to the second OR gate 20, causing the MOSFET 120 to switch between conducting/non-conducting according to the PWM (intermediate state of the MOSFET 120/pre-charge state of the state machine 130). When the pre-charge is finished and, hence, Vds drops below Vth, a constant signal is output by the second OR gate drive amplifier 15, causing the MOSFET 120 to be continuously operated in the conducting state (ON state of the state machine 130). If an OC and/or an OT has occurred or the FCS:Arm vehicle command signal has not been provided, the MOSFET 120 is operated in the non-conducting state (OFF state of the state machine 130).

Summarizing, the state machine 130 of the implementation illustrated in FIG. 5 exhibits an ON state, an OFF state and a pre-charge state. In the ON state, the MOSFET 120 is operated in the conducting state. In the OFF state, the MOSFET 120 is operated in the non-conducting state. In the pre-charge state, the MOSFET 120 is operated in an intermediate state, wherein it is switched between conducting and non-conducting according to the PWM signal. Further, the state machine 130 transitions from the OFF state to the pre-charge state upon reception of the FCS:Arm vehicle command. Further, when the pre-charge has finished, the state machine transitions to the ON state. Still further, when a failure has occurred (OT and/or OC), the state machine 130 transitions to the OFF state.

Although a MOSFET 120 is used in the embodiments described above, the present disclosure is not limited thereto and another controllable semiconductor switching unit may be used. For instance, a bipolar junction transistor (BJT), an insulated gate bipolar transistor (IGBT) or a junction-gate field effect transistor (JFET) may be used. Further, a plurality of MOSFETS 120 may be utilized as the semiconductor switching unit, wherein the MOSFETS are connected to each other in a parallel configuration.

Figure 6:
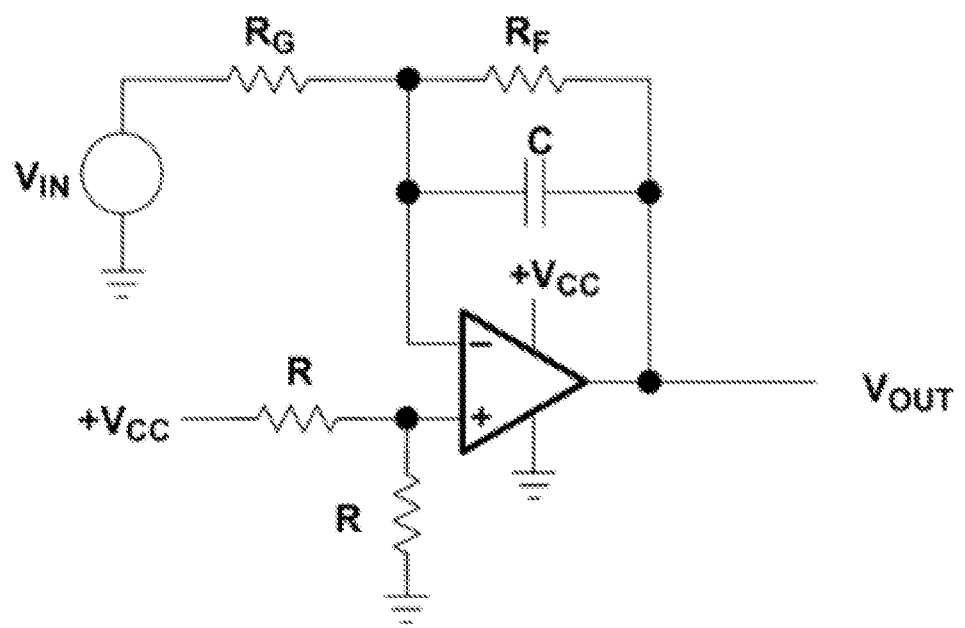
FIG. 6 illustrates an implementation example of an overcurrent detection device.

FIG. 6 illustrates an implementation example of an overcurrent detection device. The overcurrent detection device is formed by an analog integrator circuit with a resistive reset, as described, for instance, in section A.4.9 of Ron Mancini: "Op Amps For Everyone: Design Reference," Texas Instruments, Newnes, $2^{nd}$ edition, April 2003. The output of the integrator circuit is proportional to an integrated value (over a certain period of time) of the input voltage $V_{IN}$.

As commonly known, the specific integration characteristics depend on the characteristics of the resistors $R_G$ and $R_F$ as well as the capacitance C. In order to mimic an $I^2t$ curve of a fuse, for instance, several integrating circuits as illustrated may be combined in parallel. EP 0 600 751 A2 and U.S. Pat. No. 5,723,915 A describe analog circuits mimicking an $I^2t$ curve. Further, EP 3 624 339 A1 provides a description of an overcurrent limiting circuit using simple logic elements.

Input to the overcurrent detection unit may be a voltage signal corresponding to a current through the power supply line 110 provided by the current sensor 140. The output of the integrating circuit may be input to a comparator configured to compare the output with a predetermined reference voltage and output a signal indicating whether or not the integration value is above the integration threshold or not.

Figure 7:
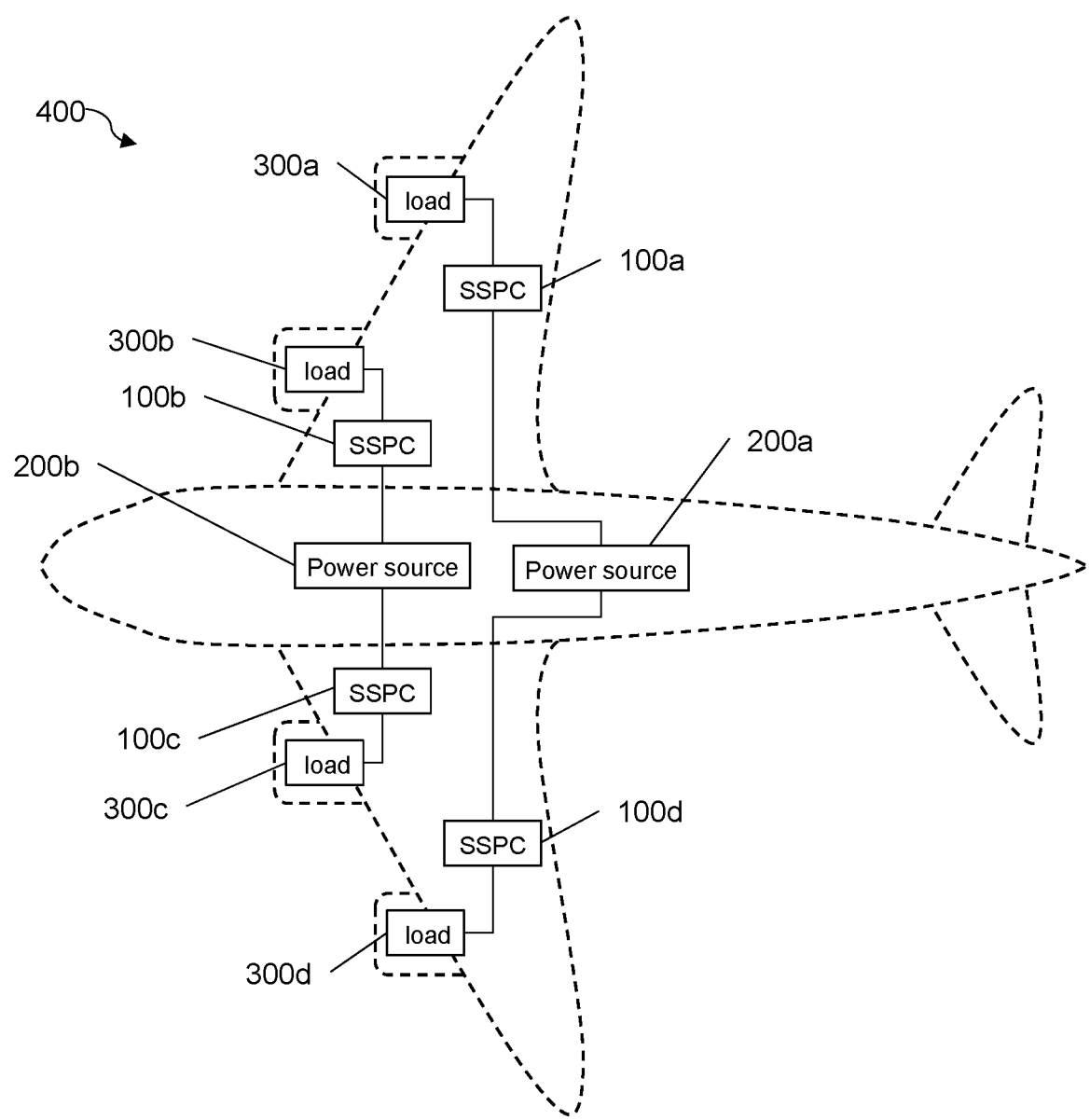
FIG. 7 is a schematic illustration of an aircraft according to an embodiment.

FIG. 7 is a schematic illustration of an aircraft according to an embodiment. The aircraft may be an aircraft having a general configuration as described in US 2016/0023754 A1, for instance. However, the present disclosure is not limited thereto, and the aircraft may be an aircraft having a general configuration of any other conventional aircraft. As illustrated in FIG. 7, the aircraft 400 comprises multiple power sources 200a, 200b, a plurality of loads 300a-d and a plurality of SSPCs 100a-100d. In the illustrated configuration, the aircraft 400 comprises two separate power supply circuits, each comprising a power source, two SSPCs and two loads connected to each other. However, the present disclosure is not limited thereto, and the aircraft 400 may comprise any other number of power sources, SSPCs and loads. The loads 300a-d may be propulsion units and, more specifically, electrically driven propulsion units like propellers or ducted fans. The SSPCs may be configured according to any one of above-described embodiments.

The present disclosure is defined by the appended claims and is not limited to the particulars of the embodiments of the above detailed description.

In summary, the present disclosure relates to a solid state power controller (SSPC). The SSPC comprises a power supply line configured to be connected between a power source and a load. Further, the solid state power controller comprises a semiconductor switching unit provided on the power supply line and configured to switch between at least two states according to a command signal. The at least two states include a conducting state and a non-conducting state. Further the solid state power controller comprises a state machine, which is configured to exhibit at least two states, including an ON state and an OFF state. The state machine is further configured to output the command signal according to a current state of the state machine.

What is claimed is:

1. A solid state power controller, comprising:
   a power supply line configured to be connected between a power source and a load;
   a semiconductor switching unit provided on the power supply line and configured to switch between at least two states, including a conducting state and a non-conducting state,
   according to a command signal; and
   a state machine configured to:
      exhibit at least three states including an ON state, an OFF state, and a pre-charge state; and
      output the command signal according to a current state of the state machine, wherein:
   in the ON state, a power dissipation within the semiconductor switching unit is controlled according to a positive supply power voltage,
   in the OFF state, the power dissipation within the semiconductor switching unit is controlled to be zero,
   in the pre-charge state, the power dissipation within the semiconductor switching unit is controlled according to a predetermined reference voltage,
   the state machine is a non-programmable logic part formed by a plurality of non-programmable electronic components and is configured to:
      transition from the OFF state to the pre-charge state based on a vehicle command transmitted via an external communication line, and
      transition from the pre-charge state to the ON state when a voltage across the semiconductor switching unit drops below the reference voltage, and
   the semiconductor switching unit is formed by one or more non-programmable electronic components.

2. The solid state power controller according to claim 1, wherein:
the command signal indicates the semiconductor switching unit to be in the non-conducting state at least partially responsive to the current state of the state machine being the OFF state; and
the command signal indicates the semiconductor switching unit to be in the conducting state at least partially responsive to the current state of the state machine being the ON state.

3. The solid state power controller according to claim 1, further comprising:
a current sensor provided on the power supply line and configured to detect a current; and
an overcurrent detection unit configured to detect an overcurrent using the current detected by the current sensor,
wherein the state machine is configured to change the current state of the state machine at least partially based on a detection result of the overcurrent detection unit.

4. The solid state power controller according to claim 3, wherein:
the overcurrent detection unit is configured to detect the overcurrent by integrating a square of the detected current for a predetermined period and comparing the integration result with an integration threshold.

5. The solid state power controller according to claim 1, further comprising:
a temperature sensor configured to detect a temperature of the solid state power controller and to output a temperature signal indicating the detected temperature to the state machine,
wherein the state machine is configured to change the current state of the state machine at least partially based on the temperature signal.

6. The solid state power controller according to claim 1, further comprising:
a voltage sensor configured to detect a voltage of the power supply line downstream of the semiconductor switching unit and to output a voltage signal indicating the detected voltage to the state machine,
wherein the state machine is configured to change the current state of the state machine at least partially based on the voltage signal.

7. The solid state power controller according to claim 1, wherein:
states of the semiconductor switching unit further include an intermediate state, wherein the semiconductor switching unit is configured to limit a current on the power supply line,
according to the command signal, to below a predetermined current threshold; and
the command signal is configured to indicate the semiconductor switching unit to be in the intermediate state at least partially responsive to the current state of the state machine being a pre-charge state.

8. The solid state power controller according to claim 7, wherein:
the state machine is configured to exhibit transition from the pre-charge state to the ON state at least partially responsive to one or more of: a voltage across the semiconductor switching unit being below a pre-charge voltage threshold, or a current through the semiconductor switching unit being below a pre-charge current threshold.

9. The solid state power controller according to claim 7, wherein:
the semiconductor switching unit is configured to exhibit an electrical resistance according to the command signal and limit the current on the power supply line.

10. The solid state power controller according to claim 1, wherein:
the semiconductor switching unit is a metal oxide semiconductor field effect transistor (MOSFET), and wherein a source terminal and a drain terminal of the MOSFET are connected to the power supply line and a gate terminal of the MOSFET is connected to the state machine.

11. The solid state power controller according to claim 10, wherein:
the state machine is configured to output the command signal to the gate terminal of the MOSFET.

12. The solid state power controller according to claim 1, further comprising:
circuitry connected to the state machine, wherein the circuitry is configured to:
monitor the state of the state machine, the current detected by a current sensor, the state of the semiconductor switching unit, a temperature detected by a temperature sensor, and/or a voltage detected by a voltage sensor; and
output a vehicle command signal to the state machine indicating a state to be transitioned to by the state machine.

13. The solid state power controller according to claim 12, wherein:
the circuitry is configured to be connected to an external communication line and to perform communication via the external communication line.

14. An aircraft, comprising:
a power source;
a load; and
a solid state power controller including:
a power supply line configured to be connected between the power source and the load;
a semiconductor switching unit provided on the power supply line and configured to switch between at least two states, including a conducting state and a non-conducting state, according to a command signal; and
a state machine configured to:
exhibit at least three states including an ON state, an OFF state, and a pre-charge state; and
output the command signal according to a current state of the state machine, wherein:
in the ON state, a power dissipation within the semiconductor switching unit is controlled according to a positive supply power voltage,
in the OFF state, the power dissipation within the semiconductor switching unit is controlled to be zero,
in the pre-charge state, the power dissipation within the semiconductor switching unit is controlled according to a predetermined reference voltage,
the state machine is a non-programmable logic part formed by a plurality of non-programmable electronic components and is configured to:
transition from the OFF state to the pre-charge state based on a vehicle command transmitted via an external communication line, and
transition from the pre-charge state to the ON state when a voltage across the semiconductor switching unit drops below the reference voltage, and
the semiconductor switching unit is formed by one or more non-programmable electronic components.

15. The aircraft according to claim 14, wherein:
the command signal indicates the semiconductor switching unit to be in the non-conducting state at least partially responsive to the current state of the state machine being the OFF state; and
the command signal indicates the semiconductor switching unit to be in the conducting state at least partially responsive to the current state of the state machine being the ON state.

16. The aircraft according to claim 14, wherein the solid state power controller further comprises:
a current sensor provided on the power supply line and configured to detect a current; and,
an overcurrent detection unit configured to detect an overcurrent using the current detected by the current sensor,
wherein the state machine is configured to change the current state of the state machine at least partially based on a detection result of the overcurrent detection unit.

17. The aircraft according to claim 14, wherein:
states of the semiconductor switching unit further include an intermediate state, wherein the semiconductor switching unit is configured to limit a current on the power supply line, according to the command signal, to below a predetermined current threshold; and
the command signal configured to indicate the semiconductor switching unit to be in the intermediate state at least partially responsive to the current state of the state machine being a pre-charge state.

18. The aircraft according to claim 14, wherein the solid state power controller further comprises:
circuitry connected to the state machine, wherein the circuitry is configured to:
monitor the state of the state machine, the current detected by a current sensor, the state of the semiconductor switching unit, a temperature detected by a temperature sensor, and/or a voltage detected by a voltage sensor; and
output a vehicle command signal to the state machine indicating a state to be transitioned to by the state machine.

19. The aircraft according to claim 18, further comprising:
a communication line arranged external to the solid state power controller,
wherein the circuitry is configured to be connected to the communication line and to perform communication via the communication line.

* * * * *